US006570431B2

(12) United States Patent
Enriquez

(10) Patent No.: US 6,570,431 B2
(45) Date of Patent: May 27, 2003

(54) TEMPERATURE-INSENSITIVE OUTPUT CURRENT LIMITER NETWORK FOR ANALOG INTEGRATED CIRCUIT

(75) Inventor: Leonel Ernesto Enriquez, Melbourne Beach, FL (US)

(73) Assignee: Intersil Americas Inc., Palm Bay, FL (US)

( * ) Notice: Subject to any disclaimer, the term of this patent is extended or adjusted under 35 U.S.C. 154(b) by 34 days.

(21) Appl. No.: 09/901,326

(22) Filed: Jul. 9, 2001

(65) Prior Publication Data

US 2003/0006820 A1 Jan. 9, 2003

(51) Int. Cl.[7] .................................................. H03L 5/00
(52) U.S. Cl. ....................................... 327/327; 327/313
(58) Field of Search ................................ 327/309, 313, 327/314, 327, 539

(56) References Cited

U.S. PATENT DOCUMENTS 3,600,696 A * 8/1971 Grandmont ................. 327/576
4,345,164 A * 8/1982 Gies ........................... 327/484
4,823,094 A * 4/1989 Reiffin ........................ 330/263
5,057,790 A * 10/1991 Landi ......................... 330/265
5,963,065 A * 10/1999 Alini et al. ................. 327/112
6,069,534 A * 5/2000 Kobayashi .............. 250/214 A

* cited by examiner

*Primary Examiner*—Terry D. Cunningham

(57) ABSTRACT

An output current limiter circuit is effectively insensitive to variations in temperature. A first arm of each of an NPN and a PNP network has a first auxiliary resistor, the current through which is proportional to temperature, and compensates for the negative temperature coefficient of the base-emitter voltage of that arm's (NPN or PNP) transistor, as well as tracks the positive temperature variation in the Vbe-bias control resistor in the other arm of the network. The other arm includes a second additional resistor, the voltage across which is established by a (fixed) bandgap voltage device, that uses a current from which the current through the first arm of the network is derived.

11 Claims, 2 Drawing Sheets

TEMPERATURE-INSENSITIVE OUTPUT CURRENT LIMITER NETWORK FOR ANALOG INTEGRATED CIRCUIT

FIELD OF THE INVENTION

The present invention relates in general to integrated circuits and components therefor, such as may be employed in telecommunication circuits and the like, and is particularly directed to a new and improved output current limiter circuit configuration that is effectively insensitive to variations in temperature.

BACKGROUND OF THE INVENTION

FIG. 1 schematically illustrates a complementary polarity bipolar transistor circuit that has been conventionally employed to limit, within reasonable tolerances, the output current produced by an analog integrated circuit, including but not limited to those employed in telecommunication signaling applications (such as subscriber line interface circuits (SLICs). In accordance with the illustrated architecture, an upstream analog circuit whose output current is to be limited, shown in block diagram form as 'analog integrated circuit (IC)' 10, has its output terminal Iout_np coupled to the base electrodes 22 and 32 of respective NPN and PNP bipolar transistors 20 and 30, and also to one end 41 of a Vbe-bias control resistor 40. The second end 42 of the resistor 40 is coupled in common to the emitters 23 and 33 of respective NPN and PNP transistors 20 and 30, and to a current limited output terminal 50, that provides a limited output current Iout_lim. NPN transistor 20 has its collector 21 coupled to a positive collector bias voltage terminal 24, while PNP transistor 30 has its collector 31 coupled to a negative bias voltage terminal 34.

In operation, if the output current being supplied to terminal Iout_np is derived from an NPN-type output current transistor within the analog IC 10, then the polarity of the voltage drop across the Vbe-bias control resistor 40 will be the same as that of the base-emitter junction of the NPN transistor 20. When this output current through the resistor 40 exceeds the Vbe of NPN transistor 20, NPN transistor 20 turns on, and its collector begins to rob base drive from the upstream output device. This current robbing operation continues until the voltage across resistor 40 is equal to the magnitude of the base-emitter voltage of NPN transistor 20 necessary to conduct a collector current that is approximately equal the total available base drive current. Namely, at total output stage base drive, $$Iout\_lim \times R_{40} = Vbe_{NPN20}. \quad (1)$$

A complementary operation occurs between Vbe-bias control resistor 40 and PNP transistor 30 when the output current originates from a PNP-type device.

Now although it is capable of effectively limiting the output current in accordance with the Vbes of the two transistors and the value of Vbe-bias control resistor 40, the current limiter circuit architecture of FIG. 1 is operationally imprecise, due to the fact that its components have opposite polarity temperature coefficients. In particular, the base-emitter voltages of the bipolar transistors 20 and 30 have relatively large negative temperature coefficients (typically on the order of −two millivolts per degree Centigrade), while the Vbe-bias control resistor 40 (which is customarily a low valued resistor) has a relatively large positive temperature coefficient $\Theta_R$ (e.g., some number of milliohms per degree Kelvin).

When these opposite polarity temperature coefficients and the manufacturing tolerances of the components are taken into account, inordinately wide variations in the limited output current over the operating temperature range of the IC can be expected.

SUMMARY OF THE INVENTION

In accordance with the present invention, this temperature change-based lack of precision in limiting the output current of an analog IC is effectively overcome by converting each NPN and PNP associated side of the current limiting circuit of FIG. 1 into a respective complementary polarity (N/P) bridge-configured network architecture. One arm of each bridge-configured circuit includes a first additional or auxiliary resistor, the current through which is proportional to temperature, and has a value such that the voltage across it is effective to both compensate for the negative temperature coefficient of the base-emitter voltage of that arm's (NPN or PNP) transistor, as well as to track the positive temperature variation in the Vbe-bias control resistor in a second arm of the circuit.

The second arm of the bridge-configured circuit also includes a second additional or auxiliary resistor, the voltage across which is established by a fixed current derived from a bandgap voltage device. The temperature-proportional current employed by the bandgap voltage device to generate a fixed bandgap voltage is mirrored into the temperature-proportional current supplied to the first auxiliary resistor. The fixed voltage across the second auxiliary resistor yields temperature-independent scaling of the voltage at which current limit occurs and recovers the voltage overhead penalty introduced by the voltage across the first auxiliary resistors. Because the modified limited output current circuit of the invention is effectively insensitive to temperature, its primary source of fluctuation is reduced to the tolerance of the Vbe-bias control resistor.

DETAILED DESCRIPTION

Figure 1:
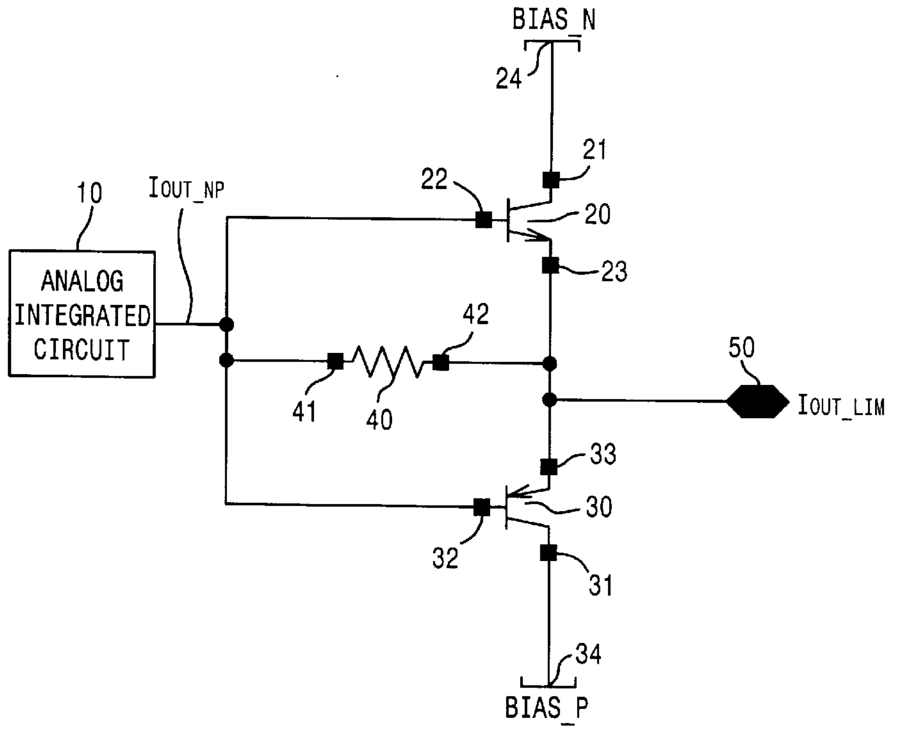
FIG. 1 (PRIOR ART)
FIG. 1 schematically illustrates a conventional complementary polarity bipolar transistor circuit used to limit the output current produced by an analog integrated circuit.
Figure 2:
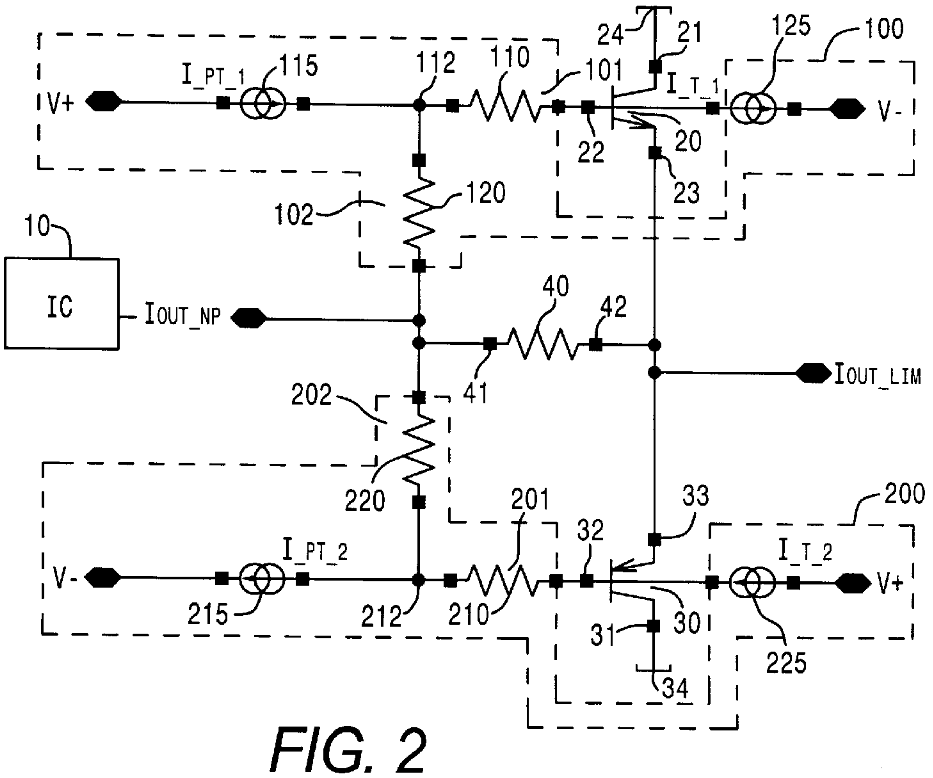
FIG. 2 is a schematic illustration of a temperature desensitizing modification of each the NPN and PNP circuit paths of the current limiting circuit of FIG. 1 to realize a pair of complementary polarity bridge-configured networks in accordance with the invention.

Attention is now directed to FIG. 2, wherein a bridge-configured temperature compensating modification of each the NPN and PNP paths of the complementary polarity bipolar transistor circuit of FIG. 1 in accordance with the invention is shown as comprising a pair of complementary (N/P) polarity, temperature compensation networks 100 and 200, respectively coupled between the Vbe bias control resistor 40 and the base drives for the respective NPN and PNP transistors 20 and 30 therein.

In particular, a 'NPN transistor associated' network 100 includes a first arm 101 containing a first additional or auxiliary (temperature compensation) resistor 110 installed between the base 22 of NPN transistor 20 and a node 112.

A first current source 115 (shown in detail in FIG. 3 to be described) supplies a first current Ipt1 to the node 112, while a second current source 125 (shown in FIG. 3) sinks a second current It1 from the common connection of the resistor 110 and the base 22 of the NPN transistor 20 in the first arm 101 of the network. Being installed in the same arm 101 of the network 100 as the base-emitter junction of NPN transistor 20, the first auxiliary resistor 110 serves to provide multiple or compound temperature compensation, in that it both overcomes the 'negative' temperature coefficient effect of the base-emitter junction of NPN transistor 20 and also tracks the 'positive' temperature variation in the Vbe-bias control resistor 40, which is located in a second arm 102 of the network 100.

The NPN network 100 further includes a second arm 102 containing a second additional or auxiliary resistor 120 coupled between the node 112 and the first end 41 of the Vbe bias control resistor 40, to which the output terminal Iout_np of the upstream 'analog IC' 10 is coupled. As will be described, the voltage across the resistor 120 is a product of the ratio of its resistance $R_{120}$ and that of a reference resistor employed by a bandgap voltage (Vbg) device in the current source circuit of FIG. 3.

As the voltage of the bandgap voltage device is effectively fixed and insensitive to temperature changes, the voltage across the second auxiliary resistor 120 is also effectively independent of temperature changes. The value of the resistance $R_{120}$ is selected, so that the voltage across it (at room temperature) balances the voltage across the first auxiliary resistor 110 in the arm 101, so that the loop equations of the two arms of the network are effectively devoid of temperature-based parameters.

As will be detailed below with reference to FIG. 3, each of the first current Ipti and the second current Iti is current mirror-derived from a temperature-proportional current used by the bandgap voltage device to generate the bandgap reference voltage Vbg. In addition, the difference (Ipt1–It1) between these two currents is a current Ip1 that is derived from the bandgap reference voltage Vbg. This difference current Ip1 is output from the node 112 through the second auxiliary resistor 120 of the second arm 102 of the network. The second auxiliary resistor is formed so as to have the same characteristics of those of the resistor in the bandgap voltage device. As a result, the voltage $V_{120}$ across the second resistor 120 is, a fixed voltage, that is proportional to the bandbap voltage Vbg and effectively insensitive to temperature.

In a complementary manner, the 'PNP transistor associated' network 200 includes a first arm 201 containing a first additional resistor 210 (of the same functionality of the first resistor 110 in the network 100) coupled between the base 32 of the PNP transistor 30 and a node 212. A first current source 215 (also shown in detail in FIG. 3) sinks a first current Ipt2 from the node 212, while a second current source 225 (also shown in detail in FIG. 3) supplies a second current It2 to the common connection of the first auxiliary resistor 210 and the base 32 of the PNP transistor 30. The PNP network 200 includes a second arm 202 containing a second additional resistor 220 (of like functionality to resistor 120 of network 100) coupled between the node 212 and the first end 41 of the Vbe bias control resistor 40.

Figure 3:
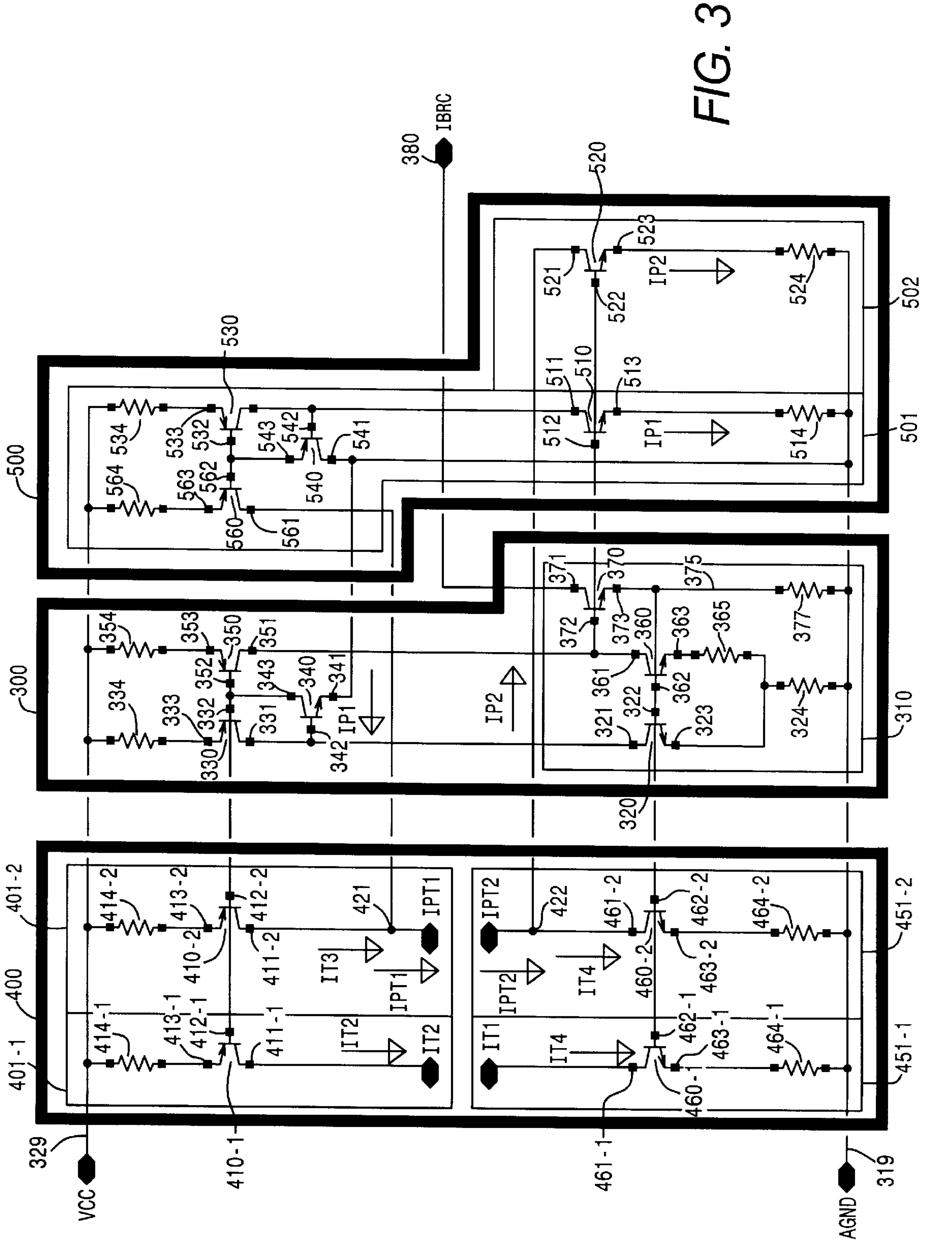
FIG. 3 schematically illustrates a circuit architecture for generating the respective currents employed in the temperature insensitive current limiting circuit architecture of FIG. 2.

Like the currents Ipt1, It1 and Ip1 of the NPN associated network 100, described above, each of the current Ipt2 and the second current It2 is current mirror-derived from the temperature-proportional current that is used by the bandgap circuit device of FIG. 3 to generate the fixed bandgap reference voltage Vbg. In addition, the difference (Ipt2–It2) between these two currents is a current Ip2 that is derived from the bandgap reference voltage Vbg. This difference current Ip2 is output from node 212 through the second auxiliary resistor 220 of the network arm 202; also, the second auxiliary resistor 220 has the same characteristics of those of the resistor in the bandgap device. As a result, the voltage across the second resistor 220 is a fixed voltage, that is proportional to the bandbap voltage Vbg and insensitive to temperature.

An embodiment of a current source architecture for supplying the above-referenced currents Ipt1, It1 to the NPN network 100, and currents Ipt2, It2 to the PNP network 200 is schematically shown in FIG. 3 as comprising a bandgap reference-based current mirror block 300 and respective current mirror stages 400 and 500 coupled thereto. The bandgap reference-based current mirror block 300 is comprised of a bandgap voltage reference stage 310, which may be configured in the manner described in my co-pending U.S. patent application Ser. No. 09/686,515, filed Oct. 11, 2000, entitled: "Mechanism for Generating Precision User-Programmable Parameters in Analog Integrated Circuit" (now U.S. Pat. No. 6,407,621, issued Jun. 18, 2002, hereinafter referred to as the '621 patent), assigned to the assignee of the present application and the disclosure of which is incorporated herein.

In order to be supplied with a current that is proportional to temperature (in degrees Kelvin (OK)), the bandgap voltage reference stage 310 is incorporated into one arm of a current mirror circuit, which serves as one of the references for the current mirror stage 400. A first arm of this current mirror circuit includes NPN transistor 320 having its emitter 323 coupled through a resistor 324 to a reference potential rail 319 (e.g., ground (GND)), and its collector 321 coupled to the collector 331 of a PNP current mirror transistor 330, the emitter 333 of which is coupled through resistor 334 to a voltage supply (e.g., VCC) rail 329.

The collector 331 of the current mirror transistor 330 is further coupled to the base 342 of a PNP transistor 340, the emitter 343 of which is coupled in common with the base 332 of PNP transistor 330 and the base 352 of a PNP transistor 350. Transistors 330 and 350 are chosen with identical geometries. The collector 341 of PNP transistor 340 is coupled to ground (GND) 319. The emitter 353 of current mirror PNP transistor 350 is coupled through a resistor 354 to the (VCC) voltage supply rail 329, and its collector 351 is used to supply a current proportional to temperature ($I=_{K*temp}$) to the collector 361 of an NPN transistor 360 within the bandgap voltage reference stage 310 and having its base 362 coupled in common with the base 322 of NPN transistor 320. Transistors 360 and 320 are a matched set with the emitter area of transistor 360 being larger than the emitter area of transistor 320. Resistors 334 and 354 are a set of matched resistors with equal value.

Within the bandgap voltage reference stage 310, the NPN transistor 360 has its emitter 363 coupled in circuit with a bandgap reference resistor 365, which is coupled to the reference voltage terminal (GND) through resistor 324. The bandgap reference resistor 365 and the resistor 324 are of the same type and construction as the resistors of the networks 100 and 200 in FIG. 2, so that their resistance characteristics effectively match.

The bandgap resistor 324 has a value $R_{324}$ such that:

$$Vbe_{320}+2*R_{324}*I_{K*temp}=V\text{bandgap}. \tag{2}$$

The base 362 of the reference NPN transistor 360 is coupled in common with the emitter 373 of an output NPN transistor 370 and to a programming node 375, which is coupled to a programming circuit element, here shown as a precision external resistor 377, referenced to ground. The base 372 of transistor 370 is coupled to the collector 361 of transistor 360, while the collector 371 of transistor 370 is coupled to a bandgap reference current terminal 380. The bandgap reference current terminal 380 is used to supply a bandgap reference current Ibrc (corresponding to the collector-emitter current through the transistor 370) having a magnitude defined by the bandgap voltage and the value of the programming resistor 377.

Equation (2), set forth above, holds irrespective of the value of the programming resistor 377 so that the following equation (3) for the collector current $Ic_{370}$ through transistor 370 may be defined:

$$Ic_{370}/\alpha_N = I_{K*temp}/\beta_N + V\text{bandgap}/R_{377} \quad (3)$$

or $$(\text{since } \alpha_N^{-1} = 1 + 1/\beta_N)$$

$$Ic_{370}*(1+1/\beta_N) = I_{K*temp}/\beta_N + V\text{bandgap}/R_{377} \quad (4)$$

Rewriting equation (4) in terms of the output current Ibrc ($Ic_{370}$), $$Ibrc = (1/\beta_N)*(I_{K*temp} - Ibrc) + V\text{bandgap}/R_{377} \quad (5)$$

or $$Ibrc \approx V\text{bandgap}/R_{377} \quad (6)$$

Thus, as described in the above-referenced '621 patent, the bandgap reference current Ibrc is independent of a variable base-emitter voltage drop factor, and may be readily programmed in accordance with the precision of the integrated circuit's internal bandgap device and the tolerance of the external programming resistor, without any significant first order errors.

As pointed out above, the band gap reference-based current mirror block 300 is employed to provide a reference current for the current mirror stage 400, which generates four reference currents It1, It2, It3 and It4. For this purpose, the current mirror stage 400 includes four current mirror arms 401-1, 401-2, 451-1 and 451-2. Arms 401-i are coupled in current mirror configuration with the current mirror transistors 330 and 350 of the band gap reference-based current mirror block 300, whereas amrs 451-i are coupled in current mirror configuration with the current mirror transistors 320 and 360 of the bandgap reference current mirror block 300.

A respective current mirror arm 401-i comprises a respective PNP current mirror transistor 410-i having its emitter 413-i coupled through a resistor 414-i to the (VCC) voltage supply rail 329, and its base 412-i coupled in common with the base 332 of PNP current mirror transistor 330 of the band gap reference-based current mirror block 300.

A respective current mirror arm 451-i comprises a respective NPN current mirror transistor 460-i, having its emitter 463-i coupled through a resistor 464-i to the (AGND) ground rail 319, and its base 462-i coupled in common with the base 322 of NPN current mirror (and bandgap) transistor 320 of the bandgap reference-based current mirror block 300.

The respective collectors 411-1, 411-2, 461-1 and 461-2 of current mirror transistors 410-1, 410-2, 460-1 and 460-2 provide the four reference currents It2, It3, It1 and It2, respectively. For identically configured (matched) components within the respective current mirror arms 401-1, 401-2, and 451-1 and 451-2, each of their output currents is the same, or It1=It2=It3=It4.

Two of these currents (It1 and It2) are applied directly to the networks 100 and 200 of FIG. 2, as described above. The remaining two currents (It3 and It4) are combined at respective current nodes 421 and 422 with the currents Ip1 and Ip2 generated by the current mirror stage 500, to produce the respective currents Iptl and Ipt2 that. are applied to nodes 112 and 212 of the respective networks 100 and 200 of FIG. 2.

For this purpose, the current mirror stage 500 contains first and second current mirrors 501 and 502, that are referenced to the bandgap reference block 300. The first current mirror 501 includes an NPN current mirror transistor 510 having its emitter 513 coupled through a resistor 514 to the reference potential (GND) rail 319, and its collector 511 coupled to the collector 531 of a PNP current mirror transistor 530, the emitter 533 of which is coupled through resistor 534 to the VCC rail 329. The first current mirror transistor 510 mirrors the bandgap voltage (Vbg)-based emitter current ($I_{370}$=Vbg/$R_{377}$) through the transistor 370 as a first current Ip1=Vbg/$R_{514}$.

The collector 531 of the PNP current mirror transistor 530 is further coupled to the base 542 of a PNP transistor 540, the emitter 543 of which is coupled in common with the base 532 of PNP transistor 530 and the base 562 of a PNP transistor 560. The collector 541 of the PNP transistor 540 is coupled to ground. The emitter 563 of current mirror PNP transistor 560 is coupled through a resistor 564 to the VCC supply rail 329, and its collector 561 is used to supply the current Ip1 to the node 421. At node 421, the current It3 from the current mirror arm 401-2 is summed with the current Ip1 from current mirror stage 501 to produce the output current Ipt1=It3+Ip1.

In like manner, the second current mirror stage 502 includes an NPN current mirror transistor 520 having its emitter 523 coupled through a resistor 524 to the GND rail 319 and its collector 521 is used to supply the current Ip2 to the node 422. At node 422, the current It4 from the current mirror arm 451-2 is summed with the current Ip2 from current mirror stage 502 to produce the output current Ipt2=It4+Ip2. For identically configured (matched) components within the two current mirror stages 501 and 502, their respective output currents Ip1 and Ip2 will be the same.

The operation of the temperature insensitive output current limiting circuit of FIG. 2 may be understood by an examination of its loop equations associated with network arms 100 and 200. The output current $Iout\_lim_N$ (associated with an NPN device) or the output current $Iout\_lim_P$ (associated with a PNP device) will attain its limit value when the base-emitter voltage of NPN transistor 20 (or PNP transistor 30) essentially equals the available drive current at the base of the output NPN (or PNP) transistors of the IC 10. For the NPN path, this base-emitter voltage will be designated Vbe$\mathbf{20}_{lim}$; for the PNP path, this base-emitter voltage will be designated Vbe$\mathbf{30}_{lim}$. This condition may be expressed by the following network loop equations.

$$Iout\_lim_N*R_{40} = -(Ipt\mathbf{1} - It\mathbf{1})*R_{120} + It\mathbf{1}*R_{110} + Vbe\mathbf{20}_{lim} \quad (7)$$

for the NPN network 100, or $$Iout\_lim_P*R_{40} = -(Ipt\mathbf{2} - It\mathbf{2})*R_{220} + It\mathbf{2}*R_{120} + Vbe\mathbf{30}_{lim} \quad (8)$$

for the PNP network 200.

As pointed out above, Ipt1=It3+Ip1 and Ipt2=It4+Ip2. Since It1=It2=It3=It4, and Ip1=Ip2, then equations (7) and (8) may be rewritten as:

$$Iout\_lim_N*R_{40}=-Ip1*R_{120}+It1*R_{110}+Vbe20_{lim} \quad (9)$$

and $$Iout\_lim_P*R_{40}=-Ip2*R_{220}+It2*R_{210}+Vbe30_{lim} \quad (10)$$

Letting the voltage drop $Ip1*R_{120}$ across the second auxiliary resistor 120 in the second arm 102 of the network 100 equal the voltage drop $It1*R_{110}$ across the first auxiliary resistor 110 in the first arm 101 of the network 100 at 27° C. (298° K), and likewise the voltage drop $Ip2*R_{220}$ across the second auxiliary resistor 220 in the second arm 202 of the network 200 equal the voltage drop 210 $It2*R_{210}$ across the first auxiliary resistor 210 in the first arm 201 of the network 200 at 27° C. (298° K), then, the I*R terms on the right side of equations (9) and (10) will cancel each other, and equations (9) and (10) may be respectively reduced to:

$$Iout\_lim_N*R_{40}=Vbe20_{lim} \text{ at } 27° \text{ C. } (298° \text{ K}) \quad (11)$$

and $$Iout\_lim_P*R_{40}=Vbe30_{lim} \text{ at } 27° \text{ C. } (298° \text{ K}) \quad (12)$$

Equations (11) and (12) reveal that in the circuit architecture of the present invention shown in FIG. 2, the addition of the auxiliary resistors 110 and 120 and the current sources Ipt1 and It1 does not alter the desired current limiting properties of the circuit of FIG. 1 for the same relatively small resistance value of Vbe bias control resistor 40. However, as will be described, the modified circuit of FIG. 2 provides temperature insensitivity.

More particularly, as noted above, $$Ip1=Ip2=Vbg/R_{377}. \quad (13)$$

Also, due to the construction of the bandgap voltage reference stage 310, $$It1=It2=(kT*\ln\rho)/(q*R_{365})=MT/R_{365}, \quad (14)$$

where M corresponds to (k*lnρ)/q, k is Boltzman's constant, T is temperature in °K, q is electron charge, and ρ is the ratio of the transistor emitter areas used in the bandgap voltage reference. Substituting equations (13) and (14) into equations (9) and (10) yields:

$$Iout\_lim_N*R_{40}=-(Vbg/R_{377})*R_{120}+(MT/R_{365})*R_{110}+Vbe20_{lim} \quad (15)$$

and $$Iout\_lim_P*R_{40}=-(Vbg/R_{377})*R_{220}+(MT/R_{365})*R_{210}+Vbe30_{lim} \quad (16)$$

Taking partial derivatives of equations (15) and (16) with respect to temperature (T) yields:

$$R_{40}*\partial Iout\_lim_N/\partial T+Iout\_lim_N*\partial R_{40}/\partial T=0+M*R_{110}/R_{365}-2 \text{ mV/°C.} \quad (17)$$

or $$\partial Iout\_lim_N/\partial T\approx[-Iout\_lim_N*\partial R_{40}/\partial T+M*R_{110}/R_{365}-2 \text{ mV/°C.}]/R_{40} \quad (18)$$

On the valid premise that the variation with temperature of the resistance $R_{40}$ of the resistor 40 is effectively linear, namely $$R_{40}(T)=R_{40}(298° \text{ K})+\Theta_R(T-298° \text{ K}), \quad (19)$$

then, the partial derivative of equation (19) with respect to temperature T yields the following resistance vs. temperature slope equation:

$$\partial R_{40}(T)/\partial T=\Theta_R \quad (20)$$

Substituting the resistance slope equation (20) into equation (18) results in:

$$\partial Iout\_lim_N/\partial T\approx[-Iout\_lim_N*\Theta_R+M*R_{110}/R_{365}-2 \text{ mV/°C.}]/R_{40} \quad (21)$$

By choosing the value of the temperature compensating resistor 110 in the network arm 101 (containing the base-emitter junction of the NPN transistor 20) such that:

$$-Iout\_lim_N*\Theta_R+M*R_{110}/R_{365}-2 \text{ mV/°C.}=0, \quad (22)$$

then $\partial Iout\_lim_N/\partial T\approx 0$ and $Iout\_lim_N$ becomes a known constant.

As a consequence, the resistance value $R_{110}$ of the temperature compensating resistor 110 in the first arm of the NPN network 100 is selected as:

$$R_{110}=(R_{365}/M)*(2 \text{ mV/°C.}+Iout\_lim_N*\Theta_R). \quad (23)$$

Likewise, for the first arm 201 of the PNP network, $$R_{210}=(R_{365}/M)*(2 \text{ mV/°C.}+Iout\_lim_P*\Theta_R), \quad (24)$$

for which $$\partial Iout\_lim_N/\partial T\approx\partial Iout\_lim_P/\partial T\approx 0. \quad (25)$$

Namely, because the first auxiliary resistors 110 and 210 of the first NPN and PNP arms 101 and 201, respectively, receive currents that are proportional to temperature, and undergo resistance changes in proportion to temperature, there is a resulting (second order) sensitivity (positive proportionality) to temperature change in the voltage across each first auxiliary resistor (110, 210). This causes the voltage ($V_{120}$, $V_{220}$) produced across the first auxiliary resistors to both compensate for the negative temperature coefficient of the base-emitter (NPN or PNP) voltage of the transistor (20 or 30) in the first network arm (101, 201), as well as track the positive temperature variation in the Vbe-bias control resistor 40 in network arm 102. As the voltage across the second auxiliary resistor (120, 220) provides temperature independent voltage equalization for the voltage across the first auxiliary resistor (110, 210), the limited output current produced by the present invention is effectively free from temperature-based parameters, as desired.

The practical effectiveness of the present invention may be realized by considering the following example of typical parameters for the components of the NPN arm 101; (a similar set of calculations can be derived for the PNP arm 102). Let the bandgap voltage reference of the bandgap voltage reference stage 310 be designed such that It1=It2=50 microamps at T=27° C., $R_{365}$=1.081 kohms, and ρ=8, which implies that $M=1.814\times10^{-4}$. Also, let the resistance $R_{40}$ increase from its value at room temperature (e.g., six ohms at 25° C.) by 25% at 125° C., such that the desired limited output current Iout_limN~100 mA. Then, $\Theta_R\times100°$ C.=0.25×6==>$\Theta_R$=0.015 ohms/°K.

Substituting these parameters into equation (23) yields a resistance value $R_{110}$ for the resistor 110 as:

$$R_{110}=1.081 \text{ K}\Omega/1.814\times10^{-4}[2\times10^{-3}+0.1\times0.015] \quad (26)$$

or $$R_{110}=20.857 \text{ K}\Omega. \quad (27)$$

Since $$It1=50\ \mu A ==> It1*R_{110}=1.043\ \text{volts.} \tag{28}$$

The remaining parameters for the NPN arm are deriving the resistance values for the resistor 120 and resistor 514. As noted above, in order for the I*R terms on the right side of equations (9) and (10) to cancel each other, the voltage drop $Ip1*R_{120}$ across the second resistor 120 must equal the voltage drop $It1*R_{110}$ across the first resistor 110 at 27° C. (298° K). From this equality and equation (13):

$$Vbg/R_{514}*R_{120}=It1*R_{110}=1.043\ \text{volts.} \tag{29}$$

For Vbg≈1.2 volts, then $$R_{120}/R_{514}=1.043/1.2=0.869, \tag{30}$$

which implies that the values of $R_{120}$ and $R_{377}$ may be arbitrarily selected, provided that their ratios comply with equation (30). However, for best accuracy, it is advisable to select $R_{514}=R_{524}=R_{377}$.

As will be appreciated from the foregoing description, the problem of the wide variations in limiting the output current over operating temperature range, associated with the opposite polarity temperature coefficients of the bias control resistor and basee-mitter junction of a conventional current limiting circuit, is effectively overcome in accordance with the present invention. The first additional resistor in the arm containing the base emitter junction is effective to both compensate for the negative temperature coefficient of the base-emitter voltage as well as track the positive temperature variation in the Vbe-bias control resistor in the other arm of the network. By establishing the voltage across the second additional resistor by a bandgap voltage device that uses the temperature-proportional current supplied to the first added resistor, the loop equations are rendered effectively free of temperature-based parameters, without introducing overhead penalties which would result from an excessively large valued Vbe-bias control resistor.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. A circuit for limiting the output current of an operational circuit comprising:

an input terminal to which said output current of said operational circuit is coupled;

an output terminal from which a limited output current is derived;

a bias control resistor coupled between said input and output terminals;

a first circuit path, containing a first resistor and a PN junction of a electronic circuit device, coupled between a first node and said output terminal; and a second resistor coupled between said first node and said input terminal; and wherein said PN junction of said electronic circuit device has a negative voltage versus temperature coefficient, and said bias control resistor and said first resistor have positive voltage versus temperature coefficients; and further including a first current source adapted to couple a first current proportional to temperature to said first node, and a second current source adapted to couple a second current proportional to temperature from a second node connecting said first resistor and said electronic circuit device, in a manner that a third current effectively independent of temperature is coupled from said first node through said second resistor.

2. The circuit according to claim 1, wherein said electronic circuit device comprises a transistor.

3. The circuit according to claim 1, further including a bandgap reference voltage device adapted to produce a fixed bandgap voltage in accordance with a current proportional to temperature, and wherein said first and second current sources comprise first and second current mirrors that are adapted to generate said first and second currents in accordance with said current proportional to temperature.

4. The circuit according to claim 1, wherein said first current source is adapted to couple to said first node said first current derived from a current used to produce a bandgap voltage, and said second current source is adapted to couple said second current, derived from said current used to produce said bandgap voltage, from said second node connecting said first resistor and said electronic circuit device, and wherein said second resistor is adapted provide a voltage thereacross proportional to said bandgap voltage.

5. The circuit according to claim 4, wherein said PN junction corresponds to the base-emitter junction of a bipolar transistor.

6. A circuit for limiting the output current of an operational circuit comprising:

an input terminal to which said output current of said operational circuit is coupled;

an output terminal from which a limited output current is derived;

a first circuit arm, containing a first resistor having a positive resistance versus temperature coefficient and a PN junction of a electronic circuit device having a negative voltage versus temperature coefficient, coupled between a first node and said output terminal;

a second circuit arm, containing a second resistor having a positive resistance versus temperature coefficient coupled between said first node and said input terminal, and a bias control resistor having a positive resistance versus temperature coefficient coupled between said input and output terminals; and a first current source adapted to couple a first current proportional to temperature to said first node, and a second current source adapted to couple a second current proportional to temperature from a second node connecting said first resistor and said electronic circuit device, in a manner that couples a third current effectively independent of temperature from said first node through said second resistor, so that the voltage across said second resistor is effectively independent of temperature.

7. The circuit according to claim 6, further including a bandgap reference voltage device adapted to produce a fixed bandgap voltage in accordance with a current proportional to temperature, and wherein said first and second current sources are adapted to generate said first and second currents in accordance with said current proportional to temperature, so that said second resistor has a voltage thereacross proportional to said bandgap voltage.

8. The circuit according to claim 7, wherein said PN junction corresponds to the base-emitter junction of a bipolar transistor.

9. A method of limiting the output current of an operational circuit comprising the steps of:

(a) coupling a first circuit arm, containing a first resistor having a positive resistance versus temperature coefficient and a PN junction of a electronic circuit device having a negative voltage versus temperature coefficient, between a first node and an output terminal providing a limited output current;

(b) coupling a second circuit arm, containing a second resistor having a positive resistance versus temperature coefficient, between said first node and an input terminal to which said output current of said operational circuit is coupled, and a bias control resistor having a positive resistance versus temperature coefficient between said input and output terminals; and (c) coupling a first current proportional to temperature to said first node, and a second. current proportional to temperature from a second node connecting said first resistor and said electronic circuit device, in a manner that causes a third current effectively independent of temperature to be coupled from said first node through said second resistor, so that the voltage across said second resistor is effectively independent of temperature.

10. The method according to claim 9, wherein said PN junction comprises the base-emitter junction of a bipolar transistor.

11. The method according to claim 10, wherein step (c) comprises generating a fixed bandgap voltage in accordance with a current proportional to temperature, and wherein said first and second currents are derived in accordance with said current proportional to temperature, so that said third current and thereby the voltage across said second resistor is proportional to said bandgap voltage.

* * * * *